(12) United States Patent
Li et al.

(10) Patent No.: US 11,978,627 B2
(45) Date of Patent: May 7, 2024

(54) SUBSTRATE FOR EPITAXIAL GROWTH, METHOD FOR MANUFACTURING THE SAME, SEMICONDUCTOR DEVICE INCLUDING THE SAME AND METHOD FOR MANUFACTURING SEMICONDUCTOR DEVICE

(71) Applicant: FUJIAN JING' AN OPTOELECTRONICS CO., LTD, Quanzhou (CN)

(72) Inventors: Juiping Li, Quanzhou (CN); Bohsiang Tseng, Quanzhou (CN); Jiahao Zhang, Quanzhou (CN); Mingxin Chen, Xiamen (CN); Binbin Li, Quanzhou (CN); Yao Huo, Quanzhou (CN)

(73) Assignee: Fujian Jing'an Optoelectronics Co., Ltd., Quanzhou (CN)

( * ) Notice: Subject to any disclaimer, the term of this patent is extended or adjusted under 35 U.S.C. 154(b) by 346 days.

(21) Appl. No.: 17/359,759

(22) Filed: Jun. 28, 2021

(65) Prior Publication Data
US 2021/0407798 A1 Dec. 30, 2021

(30) Foreign Application Priority Data
Jun. 29, 2020 (CN) .......................... 202010601306.8

(51) Int. Cl.
*H01L 33/06* (2010.01)
*C30B 25/18* (2006.01)
*H01L 21/02* (2006.01)
*H01L 33/00* (2010.01)

(52) U.S. Cl.
CPC ...... *H01L 21/02428* (2013.01); *C30B 25/186* (2013.01); *H01L 33/007* (2013.01); *H01L 33/06* (2013.01)

(58) Field of Classification Search
CPC . H01L 21/02408; H01L 33/007; H01L 33/06; C30B 25/186
See application file for complete search history.

(56) References Cited

U.S. PATENT DOCUMENTS

| 2011/0217803 A1* | 9/2011 | Nihei | ............... H01L 21/0254 |
| | | | 257/E33.028 |
| 2020/0317955 A1* | 10/2020 | Ishimizu | ........... H01L 21/30625 |

* cited by examiner

*Primary Examiner* — Robert M Kunemund
(74) *Attorney, Agent, or Firm* — Thomas | Horstemeyer, LLP

(57) ABSTRACT

A substrate for epitaxial growth includes a central region that has a center of the substrate and that serves as a non-modified region, and a peripheral region that surrounds the central region in a manner to be spaced apart from the center of the substrate by a distance and that serves as a modified region having a plurality of modified points. A method for manufacturing a substrate for epitaxial growth includes providing a substrate and forming a plurality of modified points in an interior of the substrate in position corresponding to the modified region. A semiconductor device including the substrate and a method for manufacturing the semiconductor device are also disclosed.

18 Claims, 9 Drawing Sheets

Providing a substrate having a central region that has a center of the substrate and that serves as a non-modified region, and a peripheral region that surrounds the central region in a manner to be spaced apart from the center by a distance and that serves as a modified region — S01

Forming a plurality of modified points in an interior of the substrate in position corresponding to the modified region — S02

Comparative
example

Comparative
example

Comparative
example

Example

```
┌─────────────────────────────────────────┐
│ Providing a substrate having a central  │
│ region that has a center of the substrate│
│ and that serves as a non-modified       │ ~S01
│ region, and a peripheral region that    │
│ surrounds the central region in a       │
│ manner to be spaced apart from the      │
│ center by a distance and that serves    │
│ as a modified region                    │
└─────────────────────────────────────────┘
                    │
                    ▼
┌─────────────────────────────────────────┐
│ Forming a plurality of modified points  │
│ in an interior of the substrate in      │ ~S02
│ position corresponding to the modified  │
│ region                                  │
└─────────────────────────────────────────┘
```

FIG.3

SUBSTRATE FOR EPITAXIAL GROWTH, METHOD FOR MANUFACTURING THE SAME, SEMICONDUCTOR DEVICE INCLUDING THE SAME AND METHOD FOR MANUFACTURING SEMICONDUCTOR DEVICE

CROSS-REFERENCE TO RELATED APPLICATION

This application claims priority of Chinese Invention Patent Application No. 202010601306.8, filed on Jun. 29, 2020.

FIELD

The disclosure relates to semiconductors, and more particularly to a substrate for epitaxial growth, a method for manufacturing the substrate, a semiconductor device including the substrate, and a method for manufacturing the semiconductor device.

BACKGROUND

Preparation of a substrate for epitaxial growth of an epitaxial structure is a key step in a process for manufacturing a semiconductor device, and a warpage of the substrate is one of the critical factors influencing uniformity of the epitaxial structure. Yield of the substrate directly affects the performance of the semiconductor device.

For example, a sapphire substrate is often used for supporting epitaxial growth of a gallium nitride-based (GaN-based) epitaxial structure that includes at least one light-emitting semiconductor layers which is able to emit light having wavelength ranging from visible to ultraviolet portions of the spectrum. The sapphire substrate is usually very thin. Hence, during mechanical processes that includes multi-wire-sawing (MWS), grinding, and polishing, deformation of the sapphire substrate, such as distortion, bending, and warping, would inevitably occur due to uneven stress distribution therein, which would adversely affect the quality of the GaN-based epitaxial structure disposed thereon. To be specific, in the MWS process, due to greater hardness of sapphire, diamond wires used in the MWS would suffer from higher resistance, and thus shaking or deformation of the diamond wires might occur. Consequently, two opposite ends of the thus deformed diamond wires in contact with the sapphire substrate are not symmetric, causing uneven stress distribution in the sapphire substrate, which results in distortion thereof. On the other hand, in the grinding process, abrasive particles gradually become smaller with prolonged grinding time. Because the abrasive particles of different sizes exert different pressure on the sapphire substrate, distribution of residual stress in the sapphire substrate would become uneven. Besides, polishing a single surface of the sapphire substrate would cause two opposite surfaces of the sapphire substrate to have different roughness, indicating that both of the opposite surfaces of the sapphire substrate have different residual stress therein, which would worsen the distortion of the sapphire substrate.

Furthermore, because of higher mismatch of lattice constant and coefficient of thermal expansion between the sapphire substrate and the GaN-based epitaxial structure, a warpage of the sapphire substrate might reach 100 μm during the epitaxial growth of the GaN-based epitaxial structure. During mass production of a light-emitting semiconductor device having the sapphire substrate and the GaN-based epitaxial structure disposed thereon, standard deviation of the warpage of the GaN-based epitaxial structures is also higher, resulting in lower convergence of light emission wavelength of the GaN-based epitaxial structures, thereby adversely affecting the yield of the light-emitting semiconductor devices.

In existing semiconductor technology, due to heating uniformity of the substrate being highly dependent on the warpage of the substrate, temperature distribution control during the epitaxial growth of the epitaxial structure is mainly utilized so as to obtain a better uniformity of the quality of the epitaxial structure. On the other hand, a warped shape or warpage degree of the substrate could not be effectively controlled during manufacturing a planar substrate, which involves various steps such as crystallization, wafer sawing, grinding, annealing, and polishing. Currently, in a mass production of wafers, each of which having a plurality of the light-emitting semiconductor devices thereon, standard deviation of the light emission wavelength of the light-emitting semiconductor devices in each wafer and those between the wafers is high, which is an issue to be solved. Hence, a method for controlling the warpage of the substrate is required so as to obtain a better uniformity of the quality of the epitaxial structure, thereby reducing the standard deviation of the light emission wavelength of the light-emitting semiconductor devices in each wafer and those between the wafers.

SUMMARY

Therefore, an object of the disclosure is to provide a substrate for epitaxial growth that can alleviate or eliminate at least one of the drawbacks of the prior art.

According to a first aspect of the disclosure, a substrate for epitaxial growth includes a central region and a peripheral region surrounding the central region. The central region has a center of the substrate, and serves as a non-modified region. The peripheral region is spaced apart from the center of the substrate by a distance, and serves as a modified region. The modified region has a plurality of modified points.

According to a second aspect of the disclosure, a method for manufacturing a substrate for epitaxial growth includes providing a substrate and forming a plurality of modified points therein. The substrate has a central region and a peripheral region surrounding the central region. The central region has a center of the substrate, and serves as a non-modified region. The peripheral region is spaced apart from the center of the substrate by a distance, and serves as a modified region. The modified points are formed in an interior of the substrate in position corresponding to the modified region.

According to a third aspect of the disclosure, a method for manufacturing a semiconductor device includes providing a substrate, forming a plurality of modified points therein, and forming at least one semiconductor epitaxial layer on the substrate. The substrate has a first surface, a second surface opposite to the first surface, a central region that has a center of the substrate and that serves as a non-modified region, and a peripheral region that surrounds the central region in a manner to be spaced apart from the center of the substrate by a distance and that serves as a modified region. The modified points are formed in an interior of the substrate in position corresponding to the modified region. The at least one semiconductor epitaxial layer is formed on the first surface of the substrate.

According to a fourth aspect of the disclosure, a semiconductor device includes the abovementioned substrate and at least one semiconductor epitaxial layer formed on the substrate.

BRIEF DESCRIPTION OF THE DRAWINGS

Other features and advantages of the disclosure will become apparent in the following detailed description of the embodiments with reference to the accompanying drawings, of which:

FIG. 3 is a flow diagram illustrating an embodiment of a method for manufacturing the substrate for epitaxial growth of the disclosure;

DETAILED DESCRIPTION

Figure 1A:
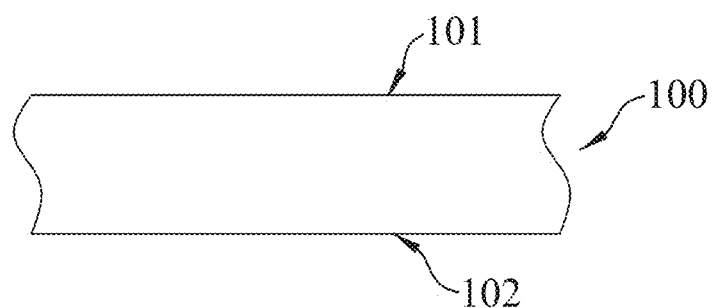
FIG. 1A is a cross-sectional view of an embodiment of a substrate for epitaxial growth of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1B:
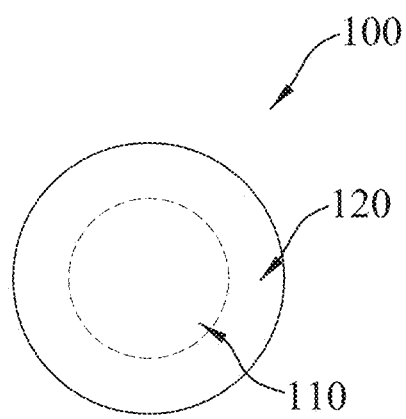
FIG. 1B is a top view taken from a first surface of the substrate shown in FIG. 1A.

Referring to FIGS. 1A and 1B, an embodiment of a substrate 100 of the disclosure includes a central region 110 and a peripheral region 120 surrounding the central region 110. The central region 110 has a center of the substrate 100, and serves as a non-modified region. The peripheral region 120 is spaced apart from the center of the substrate 100 by a distance, and serves as a modified region having a plurality of modified points 300.

Specifically, the substrate 100 has a first surface 101 and a second surface 102 opposite to the first surface 101. One of the first and second surfaces 101, 102 is adapted for the epitaxial growth of an epitaxial structure.

Based on the inventors' research, a substrate for epitaxial growth may exhibit different kinds of wafer profile when deformation such as distortion, bending, and warping occurs due to uneven stress distribution therein. Such deformation of the substrate for epitaxial growth mainly occurs in a peripheral region of the substrate, while a central region thereof that is surrounded by the peripheral region is flat without being deformed and has a radius of no less than 10 mm.

Figure 2A:
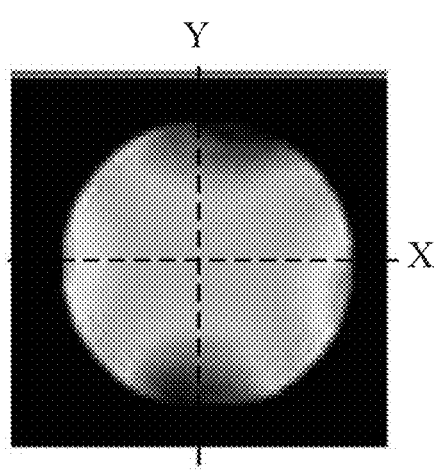
FIGS. 2A to 2C are schematic views illustrating wafer profiles of comparative examples of a conventional substrate that has uneven stress distribution therein.
Figure 2B:
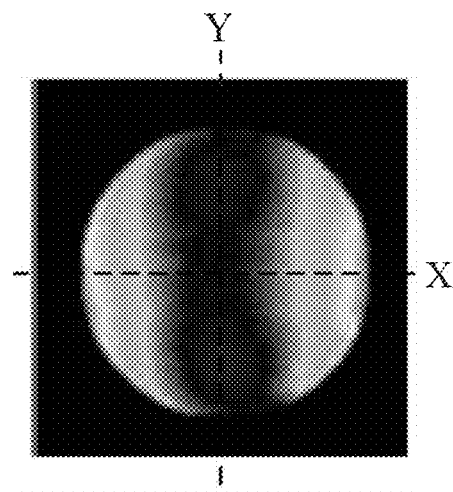
Figure 2C:
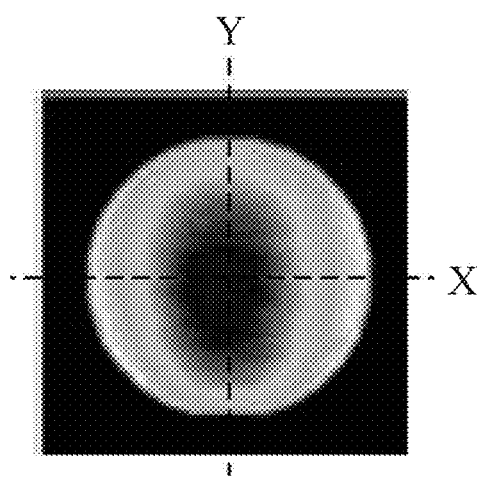

Referring to FIGS. 2A to 2C, each comparative example of the conventional substrates is made of sapphire, and has a center of the conventional substrate, a first surface, a second surface opposite to the first surface, a central region, and a peripheral region surrounding the central region. Each of the comparative examples of the conventional substrates defines a horizontal direction (X) and a vertical direction (Y), both of which extend from the center and are perpendicular to each other. Wafer profiles of the comparative examples of the conventional substrates are measured by a flatness measuring instrument, and are classified into three wafer profiles, as shown in FIGS. 2A to 2C.

For the comparative example of the conventional substrate shown in FIG. 2A, the peripheral region in the horizontal direction (X) is bended toward the first surface, and the peripheral region in the vertical direction (Y) is bended toward the second surface. Such wafer profile is often referred to as saddle-type warpage.

For the comparative example of the conventional substrate shown in FIG. 2B, the peripheral region in the horizontal direction (X) is bended toward one of the first surface and the second surface, while the peripheral region in the vertical direction (Y) is flat without bending. Such warpage profile is often referred to as cylinder-type warpage.

For the comparative example of the conventional substrate shown in FIG. 2C, both of the peripheral regions in the horizontal direction (X) and the vertical direction (Y) are bended toward one of the first surface and the second surface. The bending in the horizontal and vertical directions (X, Y) are spaced apart from the center of the conventional substrate by the same distance, while the peripheral region in the horizontal direction (X) has curvature higher than that of the peripheral region in the vertical direction (Y). Such warpage profile is often referred to as concentric ellipse-type warpage.

Figure 2D:
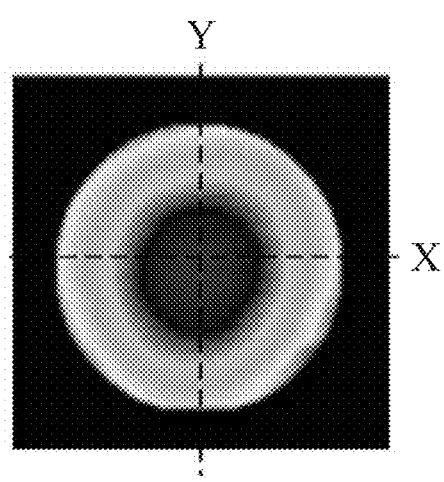
FIG. 2D is a schematic view illustrating a wafer profile of the substrate for epitaxial growth shown in FIGS. 1A and 1B.

Referring to FIG. 2D, the substrate 100 defines a horizontal direction (X) and a vertical direction (Y), both of which extend from the center and are perpendicular to each other. Wafer profile of an example of the substrate 100 is measured by the aforesaid flatness measuring instrument. Both of the peripheral regions 120 in the horizontal direction (X) and the vertical direction (Y) are bended toward one of the first surface 101 and the second surface 102. The bending in the horizontal and vertical directions (X, Y) are spaced apart from the center by the same distance, and the peripheral region 120 in the horizontal direction (X) has curvature close to that of the peripheral region 120 in the vertical direction (Y). Such wafer profile is often referred to as concentric circle-type warpage. The substrate 100 has a symmetric wafer profile and a better convergence of warpage due to uniform stress distribution therein, which is beneficial to convergence of wavelength of light emitted from at least one semiconductor epitaxial layer disposed thereon.

Furthermore, based on the abovementioned characteristics of the comparative examples of the conventional substrates as shown in FIGS. 2A to 2C, an embodiment of a method for manufacturing a substrate for epitaxial growth is provided herein to improve uniformity of warpage within the substrate.

Referring to FIG. 3, the method includes step S01 and step S02.

In step S01, the substrate 100 is provided. As shown in FIG. 1A, the substrate 100 has the first surface 101 and the second surface 102 opposite to the first surface 101. The epitaxial growth is performed on one of the first and second surfaces 101, 102. The substrate 100 can be selected from any types of substrates suitable for epitaxial growth. In some embodiments, the substrate 100 is made of sapphire, which is able to absorb multiple photons in an interior of the same, so as to form a plurality of the modified points 300 therein, thereby improving stress distribution in the substrate 100. The substrate 100 has a thickness (T) ranging from about 50 μm to about 20 mm, and a diameter ranging from about 4 inch to about 18 inch.

Furthermore, the central region 110 may have a shape of a square, a circle, or a polygon. As shown in FIG. 1B, in some embodiments, the central region 110 is a circular region, and has a radius of at least 10 mm. Since the central region of each of the comparative examples of the conventional substrates that is shown to be flat without being deformed at least has a radius of 10 mm, as shown in FIGS. 2A to 2C, there is no need to form the modified points 300 in the central region 110 of the substrate 100 to adjust stress distribution therein. In some embodiments, the distance between the peripheral region 120 and the center of the substrate 100 is no less than 10 mm.

In step S02, a plurality of the modified points 300 are formed in the interior of the substrate 100 in position corresponding to the modified region. The modified points 300 is formed by intermittently irradiating the peripheral region 120 with a laser beam along a plurality of scan paths distributed in the peripheral region 120, and forming the modified points 300 through multi-photon absorption in the interior of the substrate 100 in position corresponding to the modified region in a continuous or discontinuous manner. In some embodiments, the laser beam is generated by a pulsed laser. During the irradiation process, the laser beam moving at a predetermined rate and direction intermittently irradiates the first surface 101 of the substrate 100. Discontinuous laser dots located at different positions form the scan paths, and the modified points 300 are formed along the scan paths in a continuous or discontinuous manner.

The scan paths includes a plurality of circles, a plurality of lines, or a combination thereof. In some embodiments, the circular scan paths may be a plurality of concentric circles 210 that are centered at the center of the substrate 100. In some embodiments, the linear scan paths may be one of a plurality of radially-extending lines 220, a plurality of grid lines 230, a plurality of lines that are parallel to each other, or a plurality of lines that are not parallel to each other, such that the modified points 300 formed along the scan paths are arranged in a pattern including a plurality of the circles, a plurality of the lines, or a combination thereof. In some embodiments, the circles may be a plurality of the concentric circles 210 that are centered at the center of the substrate 100. In some embodiments, the lines may be one of a plurality of radially-extending lines 220, a plurality of the grid lines 230, a plurality of lines that are parallel to each other, or a plurality of lines that are not parallel to each other.

Figure 4:
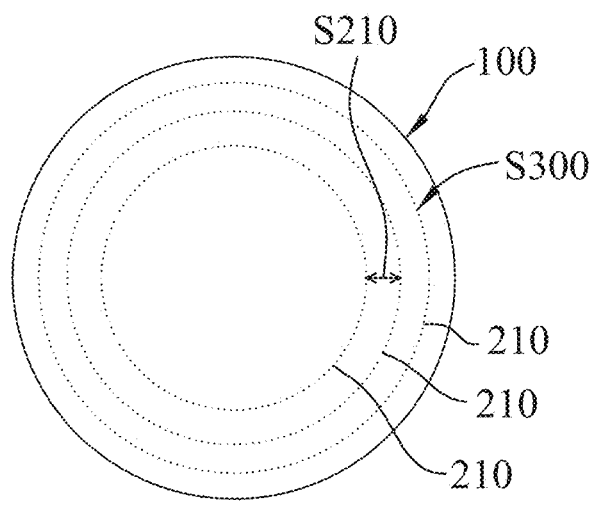
FIG. 4 is a schematic view illustrating a first example of a plurality of scan paths in the embodiment of the method for manufacturing the substrate for epitaxial growth of the disclosure.

Referring to FIG. 4, a first example of the scan paths includes a plurality of the concentric circles 210 in position corresponding to the peripheral region 120. The modified points 300 are distributed along the concentric circles 210 in a continuous or discontinuous manner in the interior of the substrate 100, and are formed by intermittently irradiating the peripheral region 120 with the laser beam along the concentric circles 210. Thereby, the modified points 300 are arranged in a pattern in the peripheral region 120, which is a plurality of the concentric circles 210 that are centered at the center of the substrate 100.

Due to the distance between the peripheral region 120 and the center of the substrate 100 being no less than 10 mm, each of the concentric circles 210 has a radius, minimum of which is 10 mm. That is to say, each of the modified points 300 is spaced apart from the center of the substrate 100 by a corresponding distance of no less than 10 mm. Furthermore, any adjacent two of the modified points 300 has a spacing S300 that is smaller than the minimum of the radius of the concentric circles 210, i.e., 10 mm. In some embodiments, the spacing S300 is not larger than 1 mm. Additionally, any adjacent two of the concentric circles 210 has a spacing S210 that is smaller than the distance by which the peripheral region 120 is spaced apart from the center of the substrate 100. In some embodiments, the spacing S210 ranges from 20 μm to 10 mm.

Figure 5:
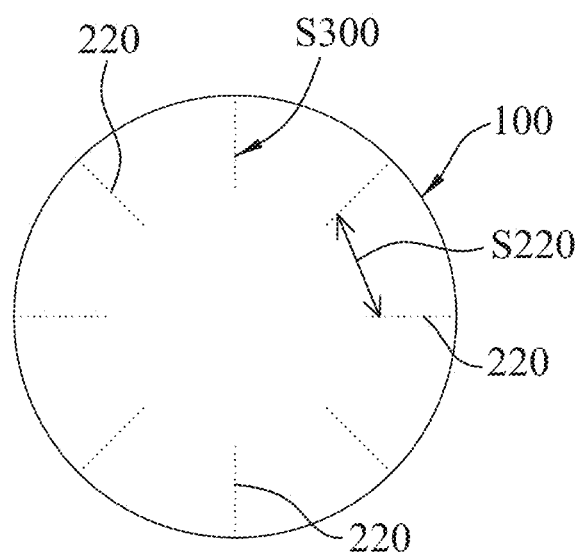
FIG. 5 is a schematic view illustrating a second example of the scan paths in the embodiment of the method for manufacturing the substrate for epitaxial growth of the disclosure.

Referring to FIG. 5, a second example of the scan paths includes a plurality of the radially-extending lines 220 that are directed to the center of the substrate 100. Each of the radially-extending lines 220 initiates from an outer boundary of the peripheral region 120 (i.e., a boundary of the substrate 100), radially extends to the center of the substrate 100, and ends at an inner boundary of the peripheral region 120. The modified points 300 are distributed along the radially-extending lines 220 in a continuous or discontinuous manner in the interior of the substrate 100, and are formed by intermittently irradiating the peripheral region 120 with the laser beam along the radially-extending lines 220. Thereby, the modified points 300 are arranged in a pattern in the peripheral region 120, which is the radially-extending lines 220 that are directed to the center of the substrate 100.

Due to the distance between the peripheral region 120 and the center of the substrate 100 being no less than 10 mm, each of the radially-extending lines 220 of the pattern is spaced apart from the center of the substrate 100 by a corresponding distance that is larger than 10 mm. That is to say, each of the modified points 300 is spaced apart from the center of the substrate 100 by a corresponding distance that is no less than 10 mm. Furthermore, any adjacent two of the modified points 300 has a spacing S300, each of which may be consistent or inconsistent. The spacing S300 is smaller than a minimum of the corresponding distance between each of the modified points 300 to the center of the substrate 100, i.e., 10 mm. In some embodiments, the spacing S300 is not larger than 1 mm. Additionally, any adjacent two of the radially-extending lines 220 has a spacing S220 that is smaller than the distance by which the peripheral region 120 is spaced apart from the center of the substrate 100. In some embodiments, the spacing S220 ranges from 20 μm to 10 mm.

Figure 6:
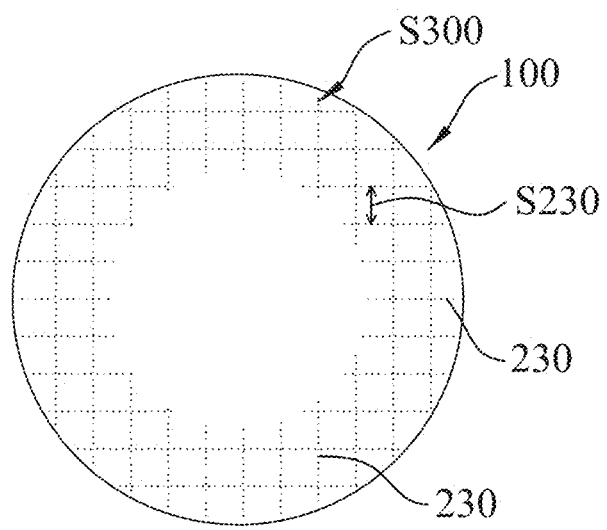
FIG. 6 is a schematic view illustrating a third example of the scan paths in the embodiment of the method for manufacturing the substrate for epitaxial growth of the disclosure.

Referring to FIG. 6, a third example of the scan paths includes a plurality of the lines that are perpendicular to each other so as to form a plurality of the grid lines 230. The modified points 300 are distributed along the grid lines 230 in a continuous or discontinuous manner in the interior of the substrate 100, and are formed by intermittently irradiating the peripheral region 120 with the laser beam along the grid lines 230. Thereby, the modified points 300 are arranged in a pattern in the peripheral region 120, which is the grid lines 230.

Due to the distance between the peripheral region 120 and the center of the substrate 100 being no less than 10 mm, each of the modified points 300 is spaced apart from the center of the substrate 100 by a corresponding distance that is no less than 10 mm. Furthermore, any adjacent two of the modified points 300 has a spacing S300. The spacing S300 is smaller than a minimum of the corresponding distance between each of the modified points 300 to the center of the substrate 100, i.e., 10 mm. In some embodiments, the spacing S300 is not larger than 1 mm. Additionally, any adjacent two of the grid lines 230 has a spacing S230 that is smaller than the distance by which the peripheral region 120 is spaced apart from the center of the substrate 100. In some embodiments, the spacing S230 ranges from 20 μm to 10 mm.

Figure 7:
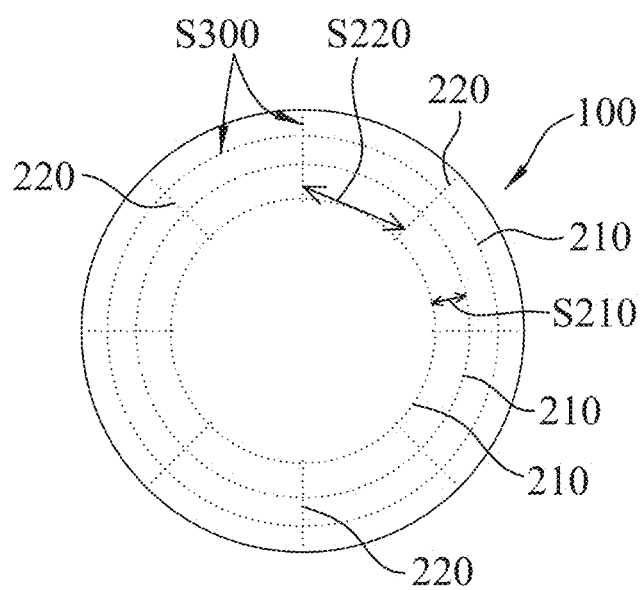
FIG. 7 is a schematic view illustrating a fourth example of the scan paths in the embodiment of the method for manufacturing the substrate for epitaxial growth of the disclosure.

Referring to FIG. 7, a fourth example of the scan paths includes a combination of a plurality of the concentric circles 210 that are centered at the center of the substrate 100 and a plurality of the radially-extending lines 220 that are directed to the center of the substrate 100. The modified points 300 are distributed along the concentric circles 210 and the grid lines 230 in the continuous or discontinuous manner in the interior of the substrate 100, and are formed by intermittently irradiating the peripheral region 120 with the laser beam along the concentric circles 210 and the grid lines 230. Thereby, the modified points 300 are arranged in a pattern in the peripheral region 120, which is a combination of a plurality of the concentric circles 210 that are centered at the center of the substrate 100 and a plurality of the radially-extending lines 220 that are directed to the center of the substrate 100.

Due to the distance between the peripheral region 120 and the center of the substrate 100 being no less than 10 mm, each of the concentric circles 210 has a radius, minimum of which is 10 mm. That is, each of the modified points 300 is spaced apart from the center of the substrate 100 by a corresponding distance that is no less than 10 mm. Furthermore, any adjacent two of the modified points 300 has a spacing S300. The spacing S300 is smaller than the minimum of the corresponding distance between each of the modified points 300 to the center of the substrate 100, i.e., 10 mm. In some embodiments, the spacing S300 is not larger than 1 mm. Additionally, any adjacent two of the concentric circles 210 has a spacing S210 that is smaller than the distance by which the peripheral region 120 is spaced apart from the center of the substrate 100. In some embodiments, the spacing S210 ranges from 20 μm to 10 mm. Any adjacent two of the radially-extending lines 220 has a spacing S220 that is smaller than the distance by which the peripheral region 120 is spaced apart from the center of the substrate 100. In some embodiments, the spacing S220 ranges from 20 μm to 10 mm.

In some embodiments, the method for manufacturing the substrate for epitaxial growth further includes a step of polishing one of the first surface 101 and the second surface 102, which is performed between step S01 and step S02.

Figure 8:
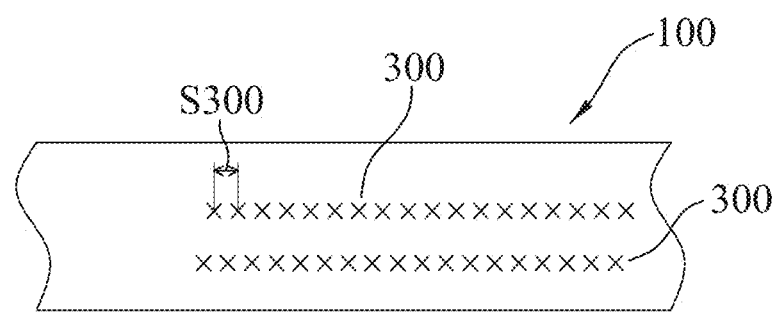
FIG. 8 is a cross-sectional view of the embodiment of the substrate for epitaxial growth illustrating distribution of a plurality of modified points therein.

Referring to FIG. 8, the modified points 300 are distributed in a discontinuous manner. The modified points 300 may be independently formed into a shape of a circle, an ellipse, or a polygon. The modified points 300 may be formed as one of different types including a polycrystalline phase (i.e., thermally modified region), and pores. The shape or type of the modified points 300 may be determined by adjusting parameters of the laser beam such as wavelength, pulse duration, or pulse shape. A range of the parameters of irradiation of the laser beam is listed in Table 1.

TABLE 1

|  | Pulse duration | Wavelength (nm) | Power (W) | Frequency (kHz) | Size of laser dots (μm) | Scan rate (mm/s) |
|---|---|---|---|---|---|---|
| Min | 1 as | 200 | 0 | 1 | 0.1 | 10 |
| Max | 1 ms | 5000 | 100 | 1000 | 1000 | 1000 |

After irradiation of the laser beam on the substrate 100 under the condition as listed in Table 1, the modified points 300 has a size ranging from 1 μm to 5 mm. The modified points 300 are formed in the peripheral region 120 of the substrate 100 at a depth ranging from 2% to 98% of the thickness (T) of the substrate 100 from the first surface 101. In some embodiments, the modified points 300 are formed at a depth ranging from 10% to 40% of the thickness (T) of the substrate 100 from the first surface 101. In other embodiments, the modified points 300 are formed at a depth ranging from 60% to 96% of the thickness (T) of the substrate 100 from the first surface 101. The modified points 300 may be distributed at the same depth, or may be independently distributed at different depths.

Referring back to FIGS. 1A and 1B, the modified points 300 of the peripheral region 120 of the substrate 100 are distributed in a continuous or discontinuous manner. Each of the modified points 300 has a corresponding distance to the center of the substrate 100 that is no less than 10 mm.

Furthermore, each of the comparative examples of the conventional substrates as shown in FIGS. 2A to 2C exhibits characteristics including distortion, bending, or warping due to uneven stress distribution that mainly occurs at the peripheral region that is spaced apart from the center of the substrate by a distance no less than 10 mm, and the central region is almost flat. Additionally, the modified points 300 formed in the substrate 100, whether in the form of polycrystalline phase or pores, would change a volume of the substrate 100 and generate stress therein, such that a localized portion of the substrate 100 where the modified points 300 are formed would be subjected to a higher amount of stress. If the modified points 300 are uniformly and thoroughly formed in the interior of the substrate 100, the stress generated across the substrate 100 would be similar, resulting in the same extent of changes in the curvature. Therefore, the resulting curvature across the substrate 100 would still be non-uniform, and the substrate 100 could not have the concentric circle-type warpage. As such, only the interior of the substrate 100 in position corresponding to the peripheral region 120, where distortion, bending, or warping most often occurs due to uneven stress distribution, is formed with the modified points 300 by irradiation of the laser beam so as to release excessive stress in the peripheral region 120. Preferably, the peripheral region 120 is spaced apart from the center by the distance that is no less than 10 mm. Thus, the curvature and bending direction of the peripheral region 120 tends to be consistent, and a wafer profile of the substrate 100 is shaped into a concentric circle. If the substrate 100 with concentric circle-type warpage is selected for subsequent processing, the wafer profile of the substrate 100 will be maintained without change after the subsequent processing, and curvature of the entire substrate 100 will be more consistent.

Figure 9:
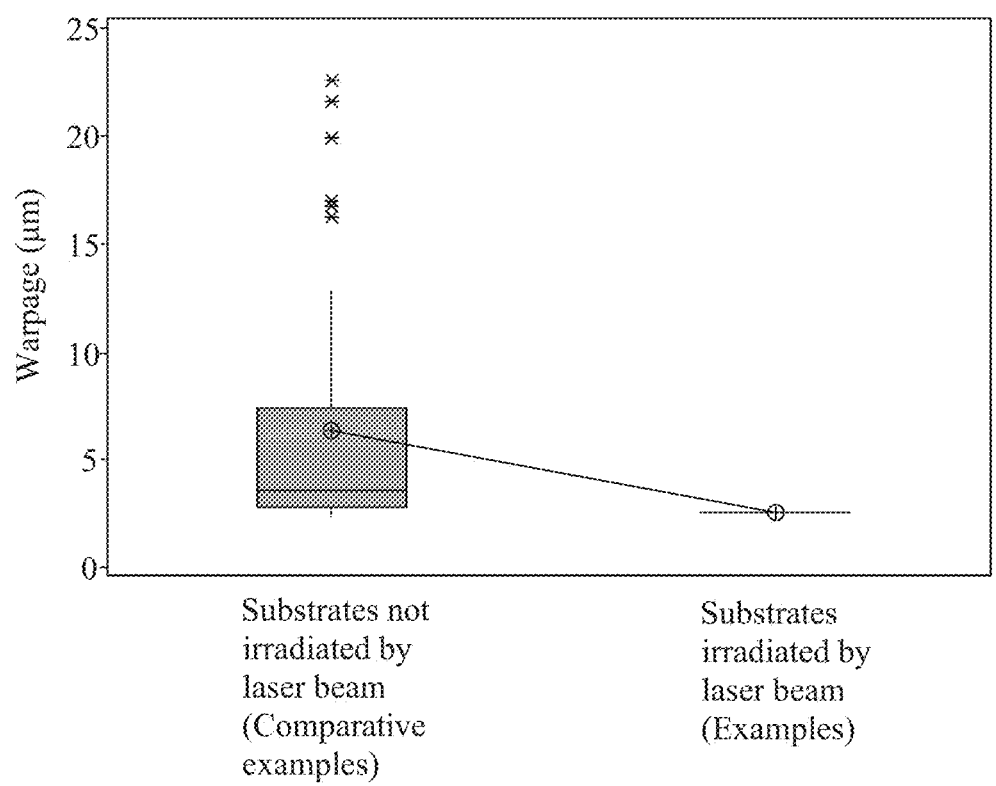
FIG. 9 is a box plot showing warpage of the comparative examples of the conventional substrate that are not irradiated by a laser beam and warpage of examples of the substrate of the disclosure that are irradiated by the laser beam.

In order to verify a wafer profile of the substrate 100 of the disclosure, warpage of the comparative examples of the conventional substrates (i.e., not irradiated by the laser beam) as shown in FIGS. 2A to 2C and those of the substrate 100 (i.e., irradiated by the laser beam) as shown in FIG. 2D are shown using a box plot (see FIG. 9). The warpage is measured using the flatness-measuring instrument, such as GSS provided by Cheng Mei Instrument Technology. A range of warpage of the comparative examples of the conventional substrates as shown in FIGS. 2A to 2C and those of the substrate 100 are listed in Table 2.

TABLE 2

| Warpage profile | Concentric circle-type | Saddle -type | Cylinder -type | Concentric ellipse - type |
|---|---|---|---|---|
| Warpage (μm) | 1~1.5 | >2.5 | <1 | 1.5~2.5 |

Referring back to FIG. 9, the warpage of the comparative examples of the conventional substrates (i.e., not irradiated by the laser beam) shown in FIGS. 2A to 2C has an average value of 3.18 μm and a standard deviation of 3.47 μm. Warpage of the substrate 100 of the disclosure (i.e., irradiated by the laser beam) has an average value of 1.01 μm and a standard deviation of 0.04 μm. As shown in Table 2, the average value of the warpage of the substrate 100 is in the range of the warpage of the concentric circle-type warpage, i.e., ranging from 1 μm to 1.5 μm. Hence, the wafer profile of the substrate 100 is classified as the concentric circle-type warpage. Furthermore, the smaller standard deviation of warpage of the substrate 100 indicates better convergence of the warpage profile, which is beneficial to convergence of wavelength of light emitted from at least one semiconductor epitaxial layer disposed thereon.

Figure 10:
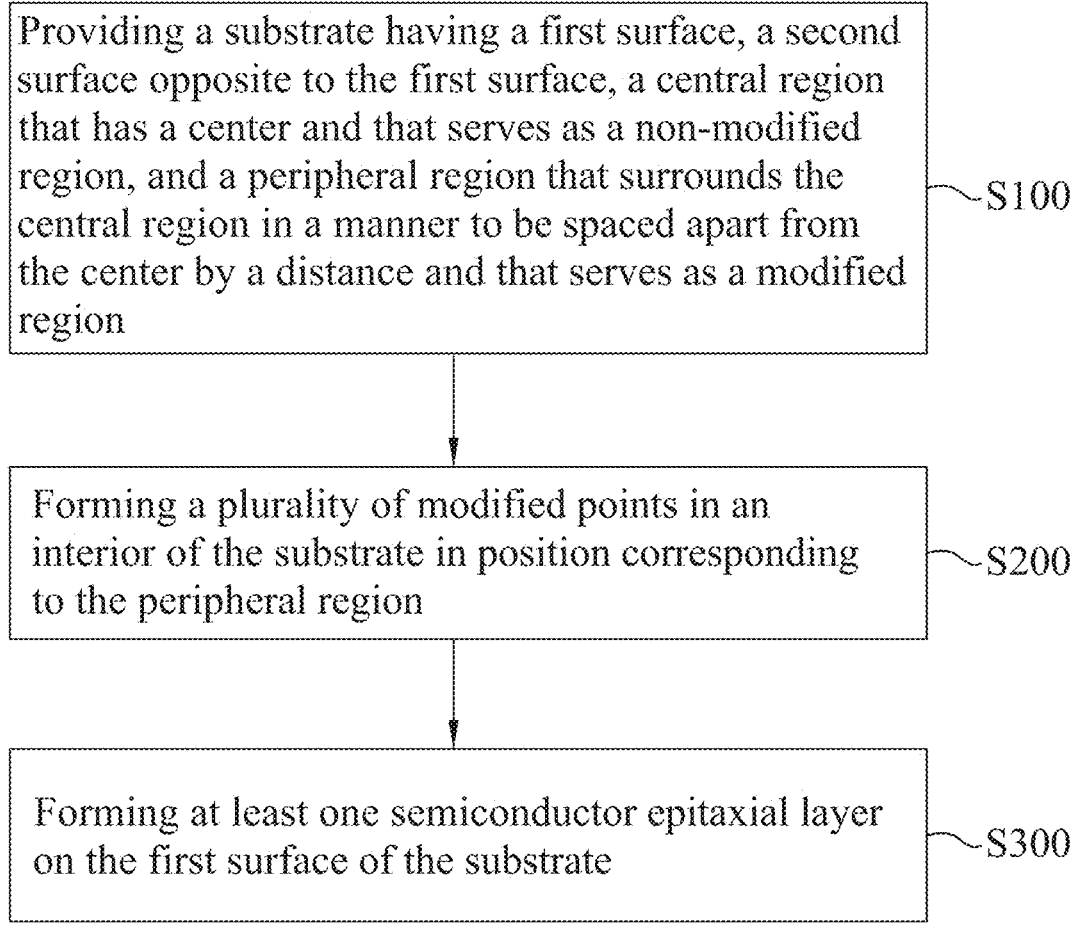
FIG. 10 is a flow diagram illustrating an embodiment of a method for manufacturing a semiconductor device of the disclosure.

Referring to FIG. 10, a method for manufacturing a semiconductor device includes steps S100, S200 and S300.

In step S100, the substrate 100 as shown in FIGS. 1A and 1B is provided.

In step S200, the modified points 300 are formed through multi-photon absorption in the interior of the substrate 100 in position corresponding to the modified region by intermittently irradiating the peripheral region 120 with a laser beam along the plurality of scan paths distributed in the peripheral region 120.

In step S300, at least one semiconductor epitaxial layer is formed on the first surface 101 of the substrate 100.

Details regarding the formation of the substrate 100 and the modified points 300 are similar to those described above with reference to FIGS. 2 to 8, and thus detailed description thereof is omitted herein.

The formation of the at least one semiconductor epitaxial layer includes disposing a first semiconductor layer 400 on the first surface 101 of the substrate 100, disposing a multi-quantum-well structure 500 on the first semiconductor layer 400 opposite to the substrate 100, and disposing a second semiconductor layer 600 on the multi-quantum-well structure 500 opposite to the first semiconductor layer 400. The second semiconductor layer 600 has electrical conductivity type opposite to the first semiconductor layer 400.

Figure 11:
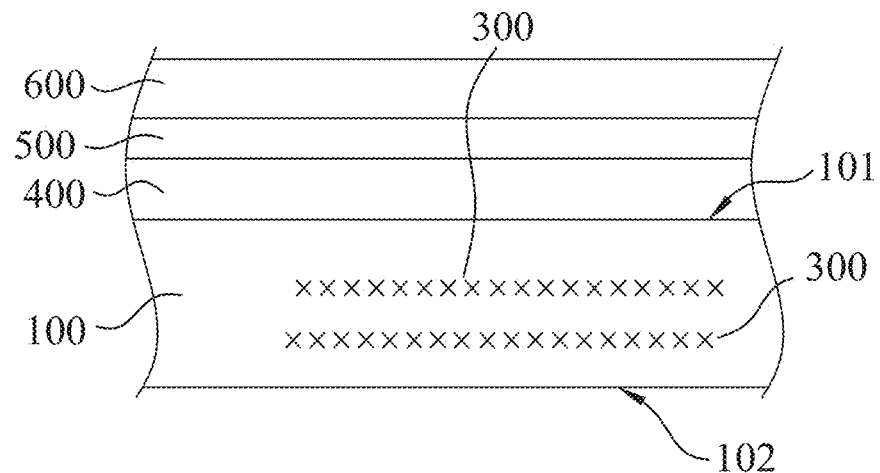
FIG. 11 is a schematic view illustrating an embodiment of the semiconductor device obtained by the method of FIG. 10.

The semiconductor device obtained by the aforesaid method includes the at least one semiconductor epitaxial layer formed on the abovementioned substrate 100. In some embodiments, the semiconductor device includes the abovementioned substrate 100, and the first semiconductor layer 400, the multi-quantum-well structure 500, and the second semiconductor layer 600 disposed on the first surface 101 of the substrate 100 in such order, as shown in FIG. 11.

Figure 12:
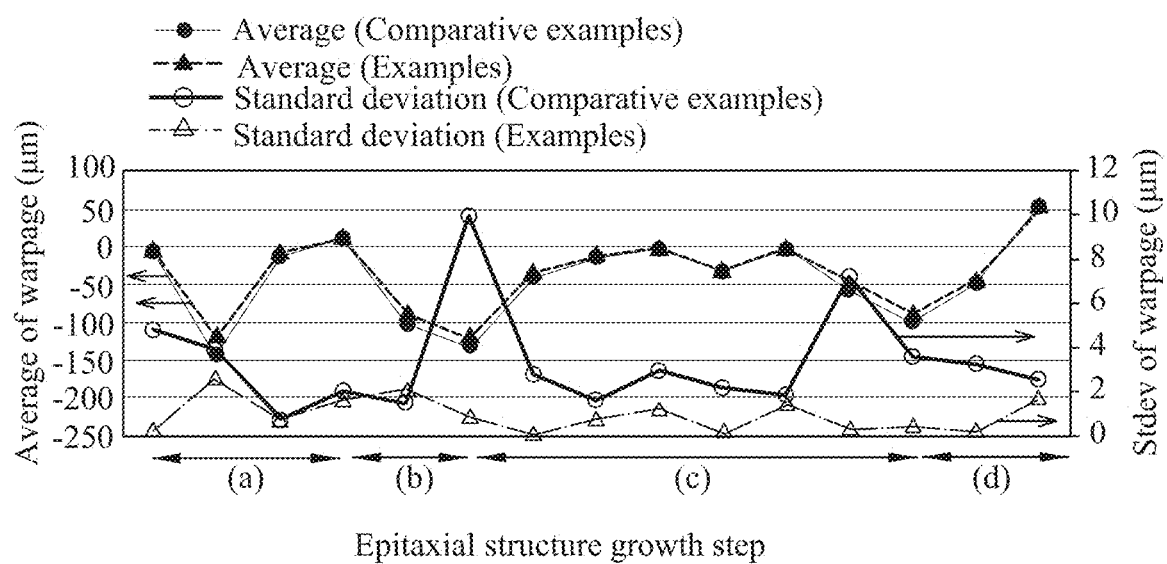
FIG. 12 is a graph showing variation of average and standard deviation of warpage versus epitaxial structure growth step of the comparative examples of the conventional substrate and those of the examples of the substrate of the disclosure.

FIG. 12 illustrates the average and standard deviation of warpage versus epitaxial structure growth step of making the comparative examples of the conventional substrates and examples of the substrate 100. A process for manufacturing an epitaxial structure includes consecutive steps of epitaxial growth of a buffer layer (a), an n-type GaN-based layer (b), a multi-quantum-well structure (c), and a p-type layer (d) in such order. Test samples include the comparative examples of the conventional substrates and the examples of the substrate 100 that are made of sapphire and that have a total sample size (N) of 1000. A sub-sample size ($n_1$) of the comparative examples of the conventional substrates which are not irradiated by a laser beam is N/2, i.e., $n_1$=500 and a sub-sample size ($n_2$) of the examples of the substrate 100 which are irradiated by the laser beam is N/2, i.e., $n_2$=500. Wafer profile of the test samples includes four of the wafer profiles shown in FIGS. 2A to 2D.

As shown in FIG. 12, the average of warpage of the examples of the substrate 100 is similar to that of the comparative examples of the conventional substrates at each consecutive step of the epitaxial growth of the epitaxial structure, however, the standard deviation of warpage of the examples of the substrate 100 is quite different from that of the comparative examples of the conventional substrates. To be specific, after epitaxial growth of the n-type GaN-based layer (b), standard deviation of warpage of the substrate 100 is about 0.6 μm and that of the conventional substrates is about 9.85 μm. During epitaxial growth of the multi-quantum-well structure (c), standard deviation of warpage of the substrate 100 is about 1.21 μm and that of the conventional substrates is about 2.54 μm. Evidently, from step (a) to step (d), the standard deviation of warpage of the examples of the substrate 100 is much lower than that of the conventional substrates. That is, a wafer profile of the substrate 100 has a better convergence.

In order to verify the improvement of convergence of the wafer profile of the substrate 100, standard deviation of light emission wavelength of a plurality of final products manufactured from one of the conventional substrates and the substrate 100 are investigated. A difference (Δ stdev) between standard deviation ($Stdev_2$) of light emission wavelength of the products manufactured from the substrate 100 and standard deviation ($Stdev_1$) of light emission wavelength of the products manufactured from one of the conventional substrates are listed in Table 3. The difference (Δ stdev) is obtained from an equation of Δ stdev=(($Stdev_2$−$Stdev_1$)/$Stdev_1$)*100.%

TABLE 3

| Final Products | Equipment for epitaxial growth | Polishing process | Light emission wavelength | Difference of stdev. of light emission wavelength |
|---|---|---|---|---|
| Display screen | Veeco RB | Single-sided | Green light | −17.6% |

TABLE 3-continued

| Final Products | Equipment for epitaxial growth | Polishing process | Light emission wavelength | Difference of stdev. of light emission wavelength |
|---|---|---|---|---|
| Micro LED | Veeco K465 | Single-sided | Green light | −21.5% |
| | | Single-sided. | Blue light | −13.6% |
| | | Double-sided | Blue light | −24.8% |
| White light source | Veeco K465 | Single-sided | Blue light | −11.1% |

The results in FIG. 12 and Table 3 show that an uniform stress distribution in the substrate 100 can be achieved when the modified points 300 are formed in the interior of the substrate 100 in position corresponding to the peripheral region 120, such that a wafer profile of the substrate 100 is a concentric-circle type, thereby permitting a better convergence of light emission wavelength of an epitaxial structure disposed on the substrate 100. To be specific, the standard deviation of light emission wavelength is reduced by approximately 11% to 25%. Further, improvement of convergence of light emission wavelength of the epitaxial structure leads to an increase in the yield of resulting products manufactured from the epitaxial structure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure.

It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A substrate for epitaxial growth, comprising:
a central region that has a center of said substrate and that serves as a non-modified region; and
a peripheral region that surrounds said central region in a manner to be spaced apart from said center of said substrate by a distance and that serves as a modified region having a plurality of modified points;
wherein said modified points are formed as one of a polycrystalline phase and pores.

2. The substrate of claim 1, wherein said modified points are distributed in said modified region in a continuous or discontinuous manner.

3. The substrate of claim 1, wherein each of said modified points is spaced apart from said center of said substrate by a corresponding distance no less than 10 mm.

4. The substrate of claim 1, wherein said modified points have a size ranging from 1 μm to 5 mm.

5. The substrate of claim 1, wherein said modified points are arranged in a pattern in said peripheral region, said pattern including a plurality of concentric circles that are centered at said center of said substrate, a plurality of lines, or combinations thereof.

6. The substrate of claim 5, wherein said pattern includes said concentric circles, each of said concentric circles being spaced apart from said center of said substrate by a corresponding distance, said corresponding distance being larger than a spacing between any adjacent two of said concentric circles of said pattern.

7. The substrate of claim 5, wherein said pattern includes said lines, each of said lines being spaced apart from said center of said substrate by a corresponding distance, said corresponding distance being larger than a spacing between any adjacent two of said modified points of said line.

8. The substrate of claim 1, wherein said modified points are arranged in a pattern in said peripheral region, said pattern including a plurality of radially-extending lines that are directed to said center of said substrate, a plurality of grid lines, or a combination of a plurality of concentric circles that are centered at said center of said substrate and said radially-extending lines that are directed to said center of said substrate.

9. A method for manufacturing a substrate for epitaxial growth, comprising:
providing a substrate having a central region that has a center of the substrate and that serves as a non-modified region, and a peripheral region that surrounds the central region in a manner to be spaced apart from the center of the substrate by a distance and that serves as a modified region; and
forming a plurality of modified points in an interior of the substrate in position corresponding to the modified region;
wherein the substrate has a first surface, a second surface opposite to the first surface, and a thickness, the epitaxial growth being performed on one of the first and second surfaces, the modified points being formed in the modified region at a depth ranging from 2% to 98% of the thickness of the substrate from the first surface.

10. The method of claim 9, wherein the distance is no less than 10 mm.

11. The method of claim 9, wherein formation of the modified points includes intermittently irradiating the modified region with a laser beam along a plurality of scan paths distributed in the modified region, and forming the modified points through multi-photon absorption in the interior of the substrate in position corresponding to the modified region in a continuous or discontinuous manner.

12. The method of claim 11, wherein the scan paths includes a plurality of concentric circles that are centered at the center of the substrate, a plurality of lines, or combinations thereof.

13. The method of claim 11, wherein the scan paths includes a plurality of radially-extending lines that are directed to the center of the substrate, a plurality of grid lines, or a combination of a plurality of concentric circles that are centered at the center of the substrate and the radially-extending lines that are directed to the center of the substrate.

14. The method of claim 11, wherein each of the scan paths is spaced apart from the center of the substrate by a corresponding distance, the corresponding distance being larger than a spacing between any adjacent two of the scan paths.

15. The method of claim 11, wherein each of the scan paths is spaced apart from the center of the substrate by a corresponding distance, the corresponding distance being larger than a spacing between any adjacent two of the modified points.

16. A method for manufacturing a semiconductor device, comprising:
providing a substrate having a first surface, a second surface opposite to the first surface, a central region that has a center of the substrate and that serves as a non-modified region, and a peripheral region that surrounds the central region in a manner to be spaced apart from the center of the substrate by a distance and that serves as a modified region;
forming a plurality of modified points in an interior of the substrate in position corresponding to the modified region; and
forming at least one semiconductor epitaxial layer on the first surface of the substrate;
wherein the substrate has a thickness, the modified points being formed in the modified region at a depth ranging from 2% to 98% of the thickness of the substrate from the first surface.

17. The method of claim 16, wherein formation of the at least one semiconductor epitaxial layer includes:
disposing a first semiconductor layer on the first surface of the substrate;
disposing a multi-quantum-well structure on the first semiconductor layer opposite to the substrate; and
disposing a second semiconductor layer on the multi-quantum-well structure opposite to the first semiconductor layer, the second semiconductor layer having electrical conductivity type opposite to the first semiconductor layer.

18. A semiconductor device, comprising:
said substrate as claimed in claim 1; and
at least one semiconductor epitaxial layer formed on said substrate.

* * * * *